United States Patent [19]

Fountain

[11] Patent Number: 5,256,981
[45] Date of Patent: Oct. 26, 1993

[54] DIGITAL ERROR CORRECTED FRACTIONAL-N SYNTHESIZER AND METHOD

[75] Inventor: Erik C. Fountain, Fullerton, Calif.

[73] Assignee: Hughes Aircraft Company, Los Angeles, Calif.

[21] Appl. No.: 843,800

[22] Filed: Feb. 27, 1992

[51] Int. Cl.$^5$ .................... H03B 19/00; H03L 7/00
[52] U.S. Cl. ...................... 328/14; 331/1 A
[58] Field of Search ................. 328/14; 331/1 A

[56] References Cited

U.S. PATENT DOCUMENTS

| | | | |
|---|---|---|---|
| 4,516,083 | 5/1985 | Turney | 331/1 A |
| 4,562,410 | 12/1985 | O'Rourke | 331/1 A |
| 4,980,652 | 12/1990 | Tarusawa et al. | 331/1 A |
| 5,045,813 | 9/1991 | Yamashita et al. | 331/16 |
| 5,093,632 | 3/1992 | Hietala et al. | 331/1 A |
| 5,128,632 | 7/1992 | Erhart et al. | 331/1 A |

*Primary Examiner*—Jin F. Ng
*Assistant Examiner*—Sinh Tran
*Attorney, Agent, or Firm*—Wanda K. Denson-Low

[57] ABSTRACT

A digital error corrected Fractional-N synthesizer having a reference frequency generator for providing a reference frequency signal and a voltage controlled oscillator for providing an output signal having a frequency equal to a fractional multiple of said reference frequency signal. The output signal of the Fractional-N synthesizer includes a residual error signal. An error signal compensation circuit is provided for generating a correction signal to cancel the residual error signal. In a preferred embodiment, the reference frequency signal is delivered to a loop phase detector which provides an error voltage proportional to a phase difference between the reference frequency signal and a feedback signal. The frequency of the output signal, which is a fractional multiple of the reference frequency signal and proportional to the error voltage, is operated upon by a plurality of divisors of a loop divider circuit to provide the feedback signal. The residual error signal appears at an output terminal of the loop phase detector. The error signal compensation circuit, which includes a binary counter and a magnitude comparator, generates the correction signal to cancel the residual error signal. A summing node is provided for canceling the residual error signal. The resistors of a summing network are scaled so that the total energy in the correction signal is equal to the total energy in the residual error signal.

15 Claims, 4 Drawing Sheets

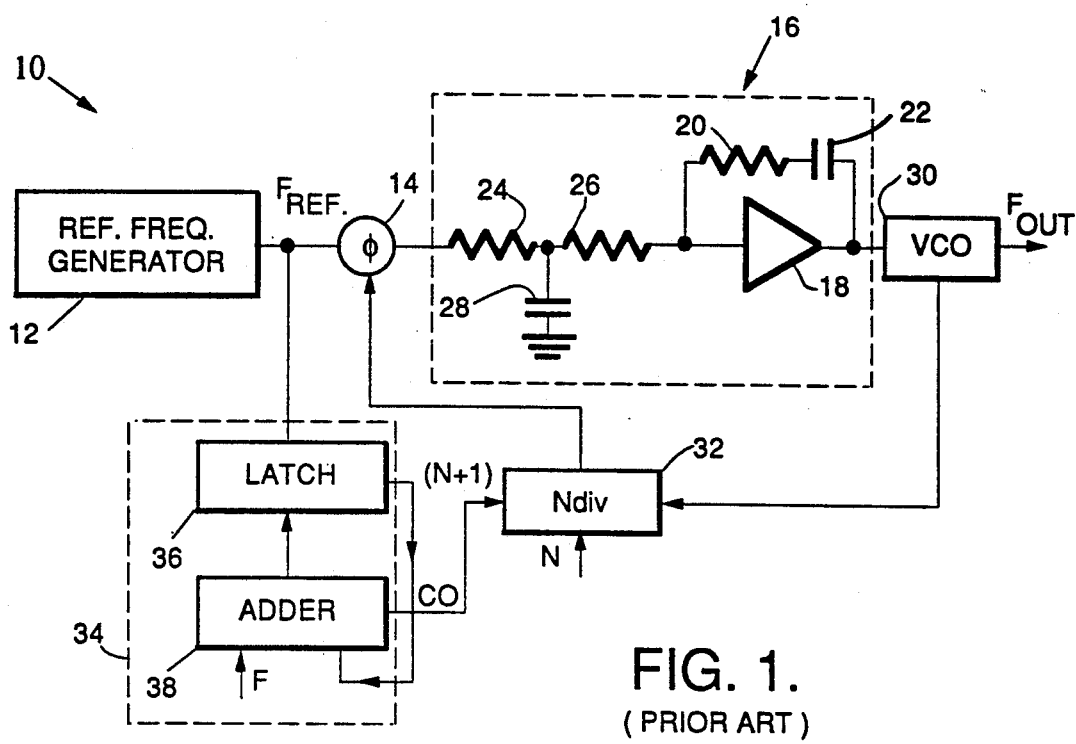
FIG. 1.
(PRIOR ART)
FIG. 2.
(PRIOR ART)
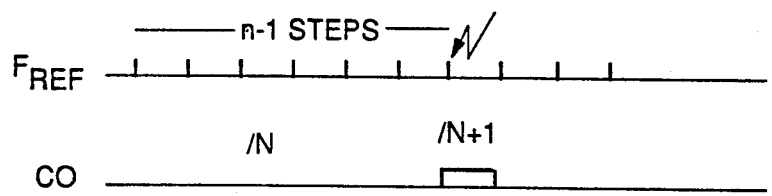
FIG. 3.
(PRIOR ART)
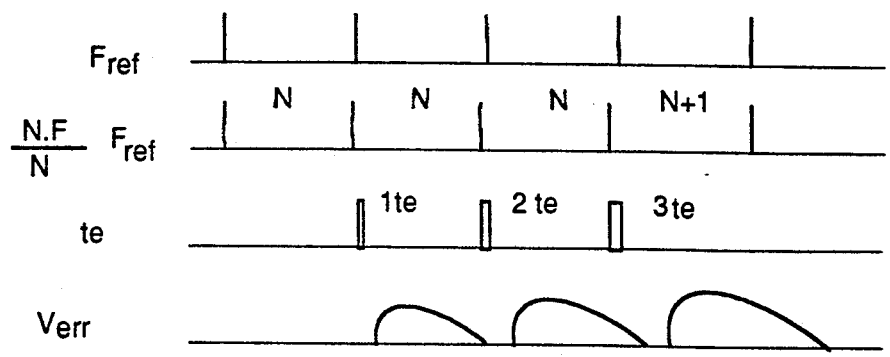

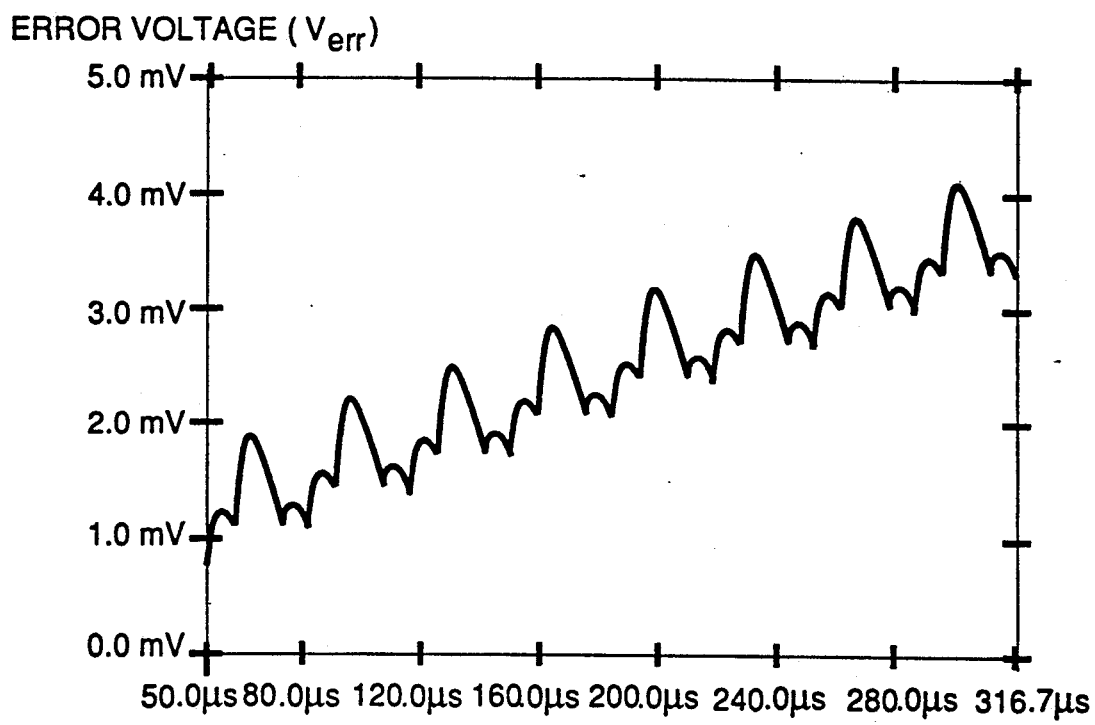
TIME  FIG. 4.
(PRIOR ART)
FIG. 5.
(PRIOR ART)
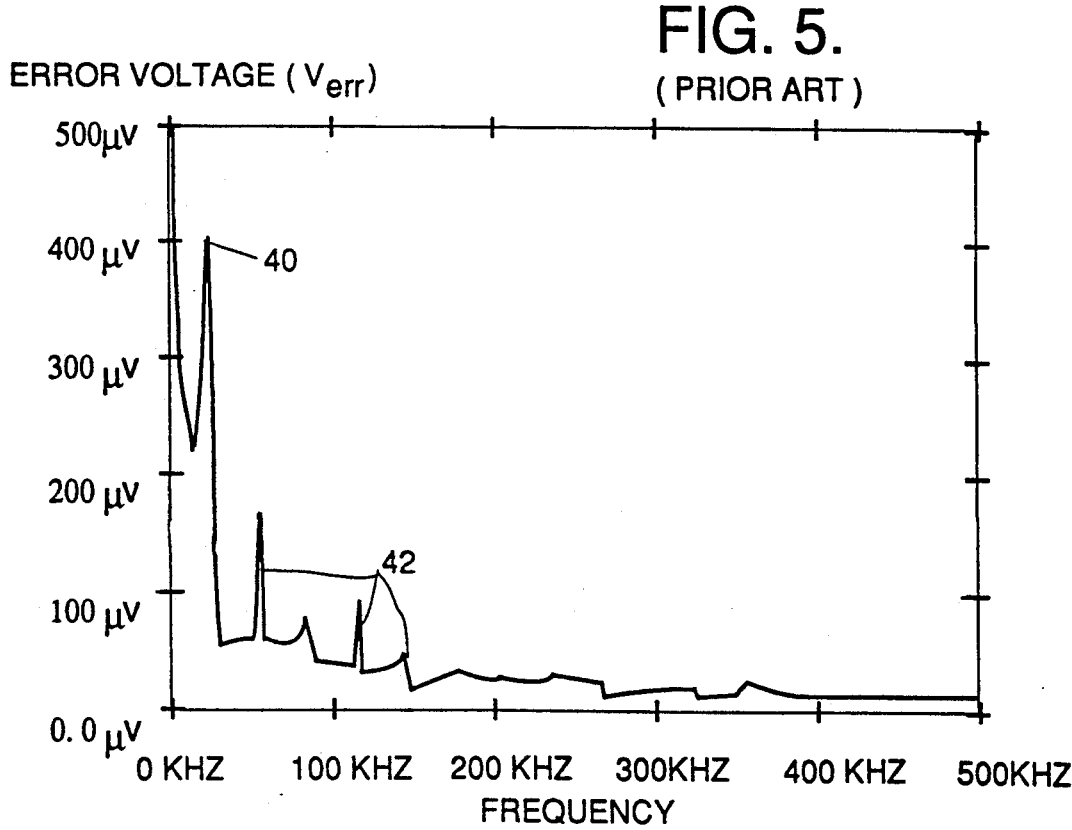

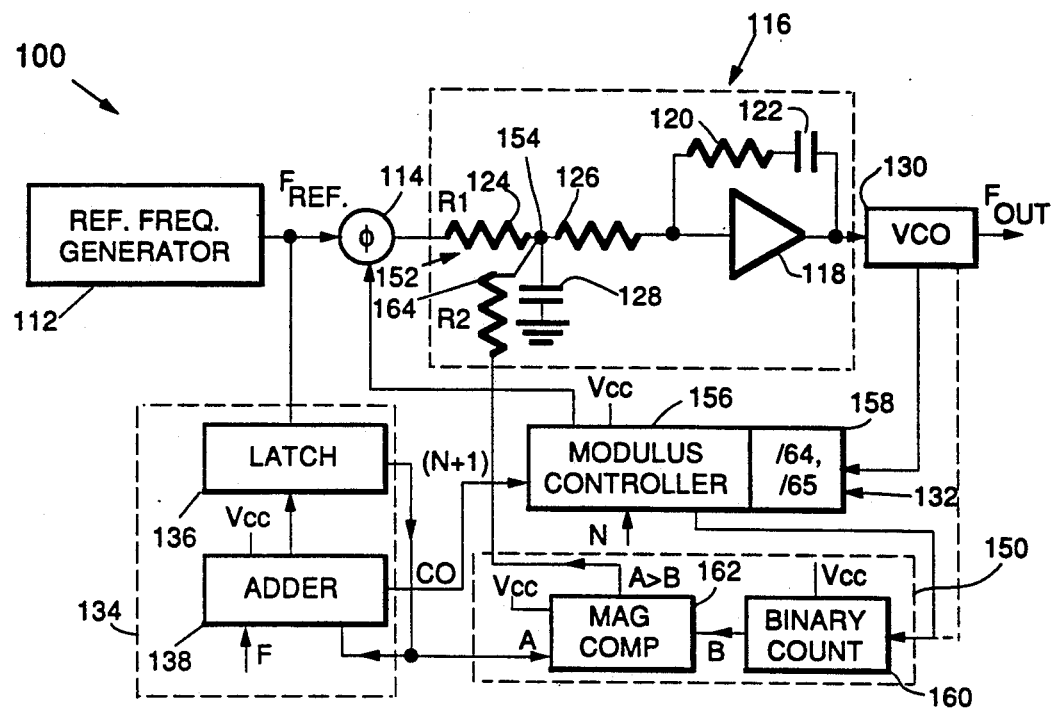
FIG. 6.
FIG. 7.
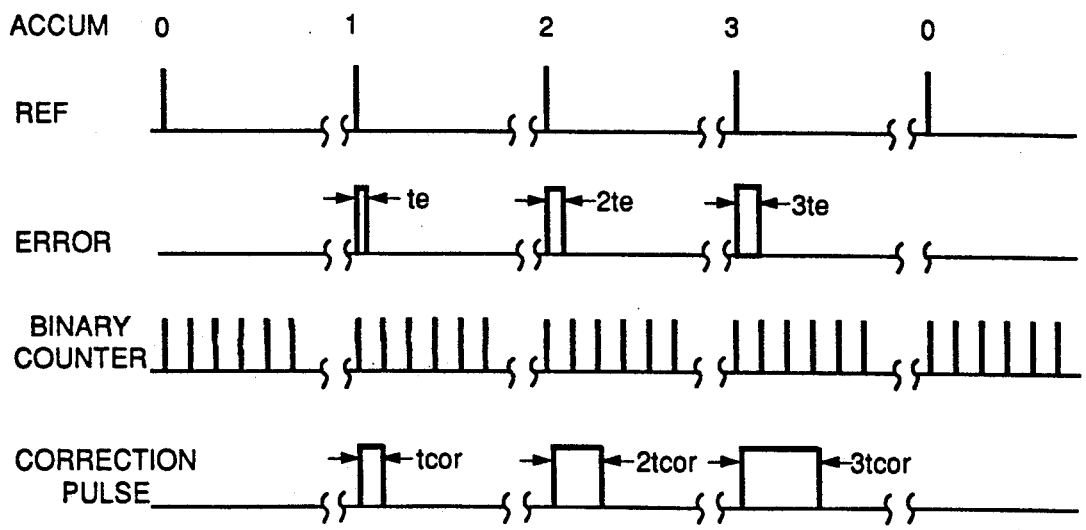

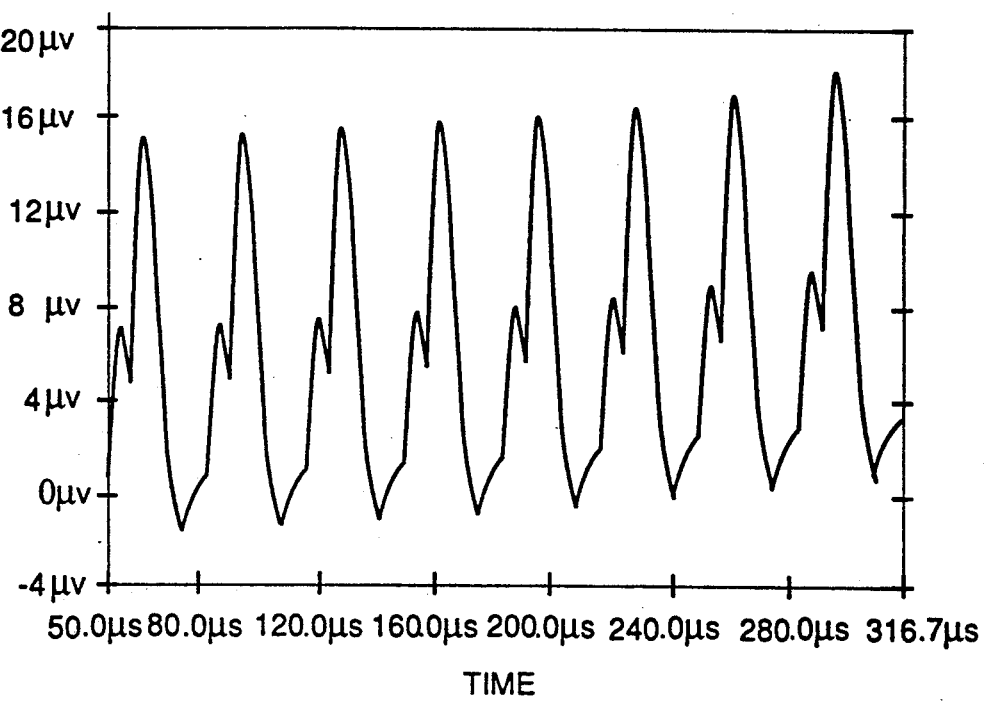
FIG. 8.
FIG. 9.
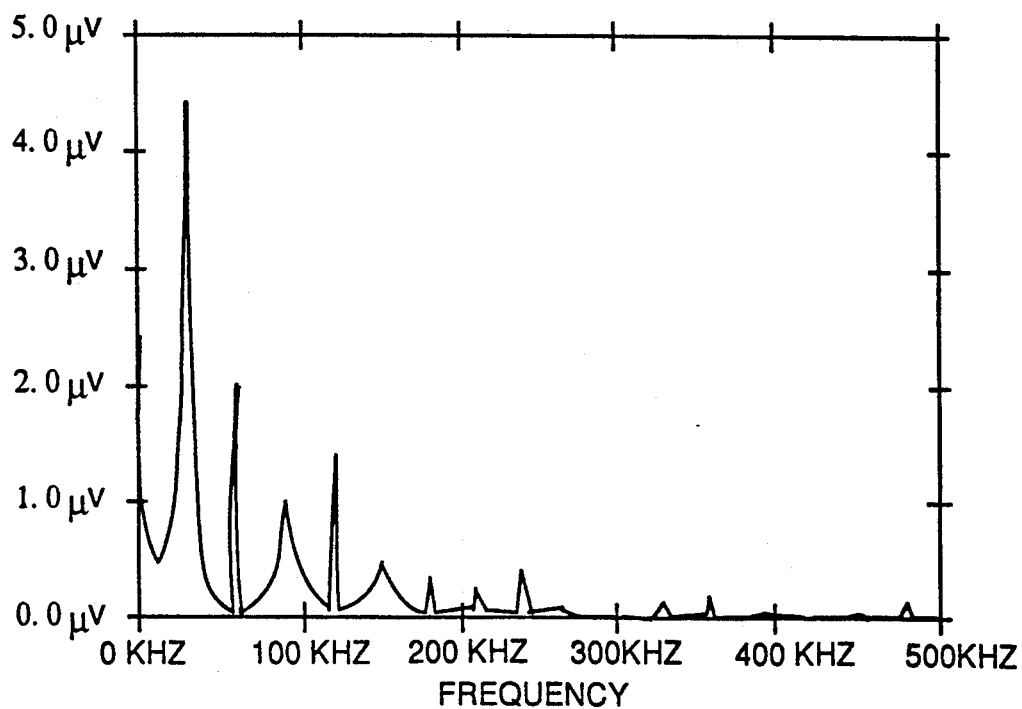

DIGITAL ERROR CORRECTED FRACTIONAL-N SYNTHESIZER AND METHOD

BACKGROUND OF THE INVENTION

1. Field of the Invention

The present invention relates to synthesizers. More specifically, the present invention relates to methods and apparatus for reducing spurious frequency errors in Fractional-N type indirect synthesizers.

While the present invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

2. Description of the Related Art

Synthesizers are utilized for selecting specific frequencies in the radio spectrum for either transmission or reception of signals. Synthesizers have the ability to step in precise frequency increments. However, indirect, phase-locked single-loop synthesizers cannot provide frequency step sizes less than an applied reference frequency. Further, certain limitations must be satisfied in single-loop synthesizer design in order to provide small frequency step sizes. Those limitations include that the synthesizer must settle at a particular frequency in a very short time and that the synthesizer provide a spectrally pure output (e.g., frequency components and harmonics not included).

To achieve small frequency step sizes, the applied reference frequency ($F_{ref}$) must be small since the synthesizer steps in increments of $F_{ref}$. In order to achieve a fast settling time at a particular synthesizer frequency, the loop filter must exhibit a wide bandwidth. However, a narrow loop filter bandwidth is required to reject the reference frequency ($F_{ref}$) component in the phase detector. These loop filter bandwidth requirements are mutually exclusive. The solution in the past to overcome the inability to provide frequency step sizes smaller than $F_{ref}$ and to overcome the mutually exclusive bandwidth problems has been to employ fractional-N synthesizers.

A single-loop synthesizer receives the reference frequency ($F_{ref}$) signal at the input terminal of a loop phase detector. The output signal of the loop phase detector is transmitted to a low pass loop filter comprised of an operational amplifier and appropriate feedback circuitry. The output of the loop filter is directed to a voltage controlled oscillator (VCO) which provides an output frequency signal. A portion of the output frequency signal is fed back to a loop divider circuit which receives a user-selected program word to program the divide ratio and to provide a divided output frequency signal.

The divided output frequency signal is transmitted to the loop phase detector and compared to $F_{ref}$ for generating a loop error voltage. The loop error voltage is filtered in the loop filter for tuning the voltage controlled oscillator. Upon being tuned, the voltage controlled oscillator is forced to slew in frequency with the slewed frequency being controlled by the tuned voltage fed into the voltage controlled oscillator. A slewed output frequency signal is fed back to the loop phase detector via the loop divider circuit for reducing the loop error voltage to zero. Thus, the output frequency signal of the voltage controlled oscillator is also the synthesizer output signal. Ideally, the loop error voltage should eventually become zero by the action of the single-loop. The phase detector monitors the changes in the single-loop due to temperature drift and component age that are responsible for changes in the output frequency signal of the voltage controlled oscillator. The error voltage output of the phase detector signals the presence of and compensates for these variations.

The slewed output frequency signal fed back to the loop divider circuit is subjected to division by the user-selected program word "N" which is actually a variable divide ratio "$N_{div}$". The value of "$N_{div}$" at any time is controlled by the fractional-N control circuit where "$N_{div}$" can assume the value of "N" or "N+1". The fractional-N control circuit comprises an accumulator circuit which includes a latch and an adder. The adder receives a fractional frequency word from an external source. The latch and the adder cooperate with the loop divider to periodically add a "+1" to the program word for changing the divide ratio to "N+1". The use of two dividers provides for an average divide ratio "DIV" effectively having an integer component and a fractional component. However, the instantaneous divide ratio is either "N" of "N+1".

The fractional divide ratio of the fractional-N synthesizer is employed to provide frequency step sizes less than $F_{ref}$. This is accomplished by varying the divide ratio over time as illustrated in the following example. To divide by a non-integer value, such as 10.1, the divider would assume the value N=10 for nine cycles in succession and then the value of N+1=11 for one cycle. Over the ten divide intervals, the average ratio is 10.1. Thus, the resulting synthesizer output frequency is 10.1 times the reference frequency $F_{ref}$, a fractional multiple.

Since the divider changes between two discrete ratios (N=10, N+1=11), a fractional-N error pulse $t_e$ is created. The output frequency signal from the voltage controlled oscillator is operating at a fractional multiple of $F_{ref}$. Dividing by the two ratios "/N" and "/N+1" causes the frequency of the output signal of the loop divider circuit to be somewhat different from the frequency of the constant $F_{ref}$ being transmitted to the loop phase detector. Although the error pulse $t_e$ is caused by changing the divide ratio in the loop divider, it manifests itself at the output terminal of the loop phase detector. Without correction, the error pulse $t_e$ will result in an undesirable spurious modulation on the synthesizer output signal.

The fractional-N error pulse $t_e$ appears at the output terminal of the phase detector at each reference clock pulse. The error pulse $t_e$ is filtered through the loop filter and generates a voltage error $V_{err}$ at the input terminal of the voltage controlled oscillator. Since an error pulse $t_e$ appears at the output terminal of the loop phase detector at each clock pulse, the voltage error $V_{err}$ accumulates over time. The accumulated voltage error $V_{err}$ modulates the output frequency signal of the voltage controlled oscillator causing spurious signals to appear in the synthesizer output signal. Thus, the fractional-N synthesizer is unable to provide a spectrally pure output signal.

Several attempts have been made to compensate for the existence of the error pulse $t_e$ appearing at the output terminal of the loop phase detector and the corresponding error voltage $V_{err}$ generated at the input terminal of the voltage controlled oscillator. Generally, the compensation schemes of the prior art include correction circuits which utilize digital-to-analog converters or switched current sources. The digital-to-analog approach is limited in that the analog output signal can drift with temperature and result in reduced error pulse cancellation. Current sources, when properly implemented, can provide reasonable insensitivity to temperature variations. However, this solution requires expensive precision components to make the current sources reasonably insensitive to temperature variations. Thus, there are cost and performance disadvantages to both prior art approaches.

Thus, there is a need in the art for an improvement in error pulse correction schemes for single-loop Fractional-N synthesizers which prevent undesirable spurious modulation of the synthesizer output signal.

SUMMARY OF THE INVENTION

The need in the art is addressed by the digital error corrected Fractional-N synthesizer and method of the present invention. The invention includes a reference frequency generator for providing a reference frequency signal and a voltage controlled oscillator for providing an output signal having a frequency equal to a fractional multiple of said reference frequency signal. The output signal of the Fractional-N synthesizer includes a residual error signal. An error signal compensation circuit is provided for generating a correction signal to cancel the residual error signal.

In a preferred embodiment, the reference frequency signal is delivered to a loop phase detector which provides an error voltage proportional to a phase difference between the reference frequency signal and a feedback signal. The frequency of the output signal, which is a fractional multiple of the reference frequency signal and proportional to the error voltage, is operated upon by a plurality of divisors of a loop divider circuit to provide the feedback signal. The residual error signal appears at an output terminal of the loop phase detector. The error signal compensation circuit, which includes a binary counter and a magnitude comparator, generates the correction signal to cancel the residual error signal. A summing node is provided for canceling the residual error signal. The resistors of a summing network are scaled so that the total energy in the correction signal is equal to the total energy in the residual error signal.

BRIEF DESCRIPTION OF THE DRAWINGS

FIG. 1 is a simplified block diagram of an illustrative embodiment of a single-loop Fractional-N synthesizer of the prior art.

FIG. 2 is a timing diagram of the sequence of events in the operation of the loop divider and accumulator circuits of the prior art single-loop Fractional-N synthesizer of FIG. 1.

FIG. 3 is a timing diagram of the prior art single-loop Fractional-N synthesizer of FIG. 1 particularly illustrating the error pulse ($t_e$) and the associated error voltage ($V_{err}$).

FIG. 4 is a graph illustrating the error voltage ($V_{err}$) versus time for an uncorrected loop error in the prior art Fractional-N synthesizer of FIG. 1.

FIG. 5 is a graph illustrating the error voltage ($V_{err}$) versus frequency for an uncorrected loop error in the prior art Fractional-N synthesizer of FIG. 1.

FIG. 6 is a simplified block diagram of an illustrative embodiment of a single-loop error corrected Fractional-N synthesizer of the present invention showing the error pulse compensation logic circuitry.

FIG. 7 is a timing diagram of the single-loop error corrected Fractional-N synthesizer of FIG. 6 particularly illustrating the error pulse ($t_e$) and the correction pulse ($t_{cor}$) generated in response thereto.

FIG. 8 is a graph illustrating the error voltage ($V_{err}$) versus time for a corrected loop error in the Fractional-N synthesizer of FIG. 6.

FIG. 9 is a graph illustrating the error voltage ($V_{err}$) versus frequency for a corrected loop error in the Fractional-N synthesizer of FIG. 6.

DESCRIPTION OF THE INVENTION

Synthesizers are utilized for selecting specific frequencies in the radio spectrum for either transmission or reception of signals. Synthesizers have the ability to step in precise frequency increments. However, an indirect phase-locked single-loop synthesizer cannot provide frequency step sizes less than the reference frequency $F_{ref}$. Fractional-N synthesizers of the prior art have overcome this limitation by means of a fractional divide ratio. This is achieved by varying the divide ratio over time.

A simplified block diagram of a Fractional-N synthesizer 10 of the prior art is shown in FIG. 1. Shown therein is a reference frequency generator 12 which provides a reference frequency $F_{ref}$ to the input terminal of a loop phase detector 14. The output signal of the loop phase detector 14 is transmitted to a low pass loop filter 16 comprised of an operational amplifier 18 with a series feedback resistor 20 and capacitor 22 and filter elements including resistors 24 and 26 and capacitor 28 connected to electrical ground. The output of the loop filter 16 is directed to a voltage controlled oscillator (VCO) 30 which provides an output frequency signal $F_{out}$. A portion of the output frequency signal $F_{out}$ is fed back to the loop phase detector 14 via a loop divider circuit 32. The divider circuit 32 receives an external user-selected program word "/N" to program the divide ratio and to provide a divided output frequency signal.

The divided output frequency signal is transmitted back to the loop phase detector 14 and compared to $F_{ref}$ for generating a loop error voltage as is known in the art. The loop error voltage is filtered in the loop filter 16 for tuning the voltage controlled oscillator 30 which is forced to slew in frequency. The slewed frequency is controlled by the tuned voltage delivered to the voltage controlled oscillator 30. A slewed output frequency signal $F_{out}$ is fed back to the loop phase detector 14 via the loop divider circuit 32 for reducing the loop error voltage to zero. The output frequency signal $F_{out}$ of the voltage controlled oscillator 30 is also the synthesizer output signal. The loop error voltage will eventually approach zero by the feedback action of the single-loop synthesizer. The phase detector monitors the changes in the single-loop due to temperature drift and component age and permits compensating for these variations.

The slewed output frequency signal fed back to the loop divider circuit 32 is subjected to division by the user-selected program word "/N". The divider circuit 32 is represented by the divide ratio "$N_{div}$" and is equivalent to $$N_{div}=F_{out}/F_{ref} \qquad [1]$$

Therefore, $$F_{out}=N_{div}\times F_{ref} \qquad [2]$$

The value of "$N_{div}$" at any time is controlled by the fractional-N control circuit where "$N_{div}$" can assume the value of "/N" or "/N+1". The fractional-N control circuit comprises an accumulator circuit 34 which includes a latch 36 and an adder 38. The adder 38 receives a fractional frequency word "F" from an external source. The latch 36 and the adder 38 cooperate with the loop divider 32 to periodically add a "+1" to the program word "/N" for changing the divide ratio to "/N+1". The use of two dividers provides for an average divide ratio "DIV" effectively having an integer component and a fractional component. However, the instantaneous divide ratio is either "/N" or "/N+1".

The initial objective is to achieve a frequency step size smaller than $F_{ref}$. The desired frequency step is an integral submultiple (e.g., fraction) of the loop reference frequency $F_{ref}$ as shown below where $$f_{step}=F_{ref}/n \qquad [3]$$

and "n" is radix of the adder 38. The adder 38 adds the fractional frequency word "F" to the previous sum stored in the latch 36 at each clock edge of $F_{ref}$. The new sum thereafter replaces the previously stored sum in the latch 36. The latch 36 holds the numerical value of the adder 38 which is located at the input of the latch 36 for one reference clock period. This action is repeated from one reference clock period to the next reference clock period. The adder 38 receives the output of the latch 36 and again adds the fractional frequency word "F" thereto. After each clock cycle, the sum of the adder 38 increases providing an accumulator action.

The adder 38 accumulates at a rate controlled by $F_{ref}$ until the value of "n-1" is reached. After the next reference clock, the output of the adder 38 reaches a maximum value. Thereafter, a carryover output "$C_o$" having the value of a logical-1 is produced and the output of the adder 38 goes to zero. The carryover output "$C_o$" is transmitted back to the loop divider circuit 32 as shown in FIG. 1. This action causes the loop divider circuit 32 to increase its divide ratio $N_{div}$ from "/N" to "/N+1" for one reference clock cycle. The following reference clock cycle causes the value of the accumulator circuit 34 carryover output $C_o$ to return to zero and the sequence repeats.

The periodically varying loop divide ratio $N_{div}$ represents a fraction when averaged over multiple reference clock cycles. Thus, the average divide ratio "DIV" varies over time in which the instantaneous loop divide ratio $N_{div}$ has the value "/N" for $(n-1)$ reference clock cycles and the value "/N+1" for one additional reference clock cycle. A representation of the average divide ratio "DIV" is clearly shown in FIG. 2. The top line shown in FIG. 2 illustrates a plurality of periodic reference clock cycles wherein the maximum value or radix of the adder 38 is indicated to be "n". Additionally, it is shown that the instantaneous divide ratio is "/N" for $(n-1)$ reference clock cycles and that the instantaneous divide ratio is "/N+1" for one additional reference clock cycle. The bottom line in FIG. 2 represents the carryover output $C_o$ which is a logical-1 when the divide ratio is "/N+1".

The fractional or average divide ratio "DIV" is determined in the following manner. It is known from equation [3] that the small frequency step size "$f_{step}$" is determined by dividing $F_{ref}$ by "n", the radix of the adder 38. The fractional frequency word "F" (e.g., the fractional portion of the program word) is equal to $$F=1/n \qquad [4]$$

while the integer portion of the program word is determined by the instantaneous divide ratio "$N_{div}$" which is "/N" for $(n-1)$ reference clock cycles and "/N+1" for one additional reference clock cycle. Therefore, the average divide ratio "DIV" which is averaged over "n" reference clock cycles is determined as follows $$DIV=[(n-1)N+1(N+1)]/n \qquad [5]$$

Upon simplification of equation [5], the following expression results in $$DIV=N+(1/n) \qquad [6]$$

The term "N" in equation [6] represents the integer portion of the program word and is fed to the loop divider circuit 32 shown in FIG. 1. The term "1/n" as indicated in equation [4] represents the fractional portion "F" of the program word and is fed to the adder 38 also shown in FIG. 1. Therefore, the simplified form of the average divide ratio is $$DIV=N.f \qquad [7]$$

In the single-loop fractional-N divider, the fractional portion "F" provides for the smaller frequency step size while still permitting the larger integer portion "N" to provide the faster settling time. Equation [2] recites that the output frequency $F_{out}$ is equal to the instantaneous divide ratio $N_{div}$ times the reference frequency $F_{ref}$. Substituting the average divide ratio "DIV" for the instantaneous divide ratio $N_{div}$ in equation [2], the following expression is obtained $$F_{out}=N.F\times F_{ref} \qquad [8]$$

Thus when locked, the loop voltage controlled oscillator 30 will provide a frequency output signal $F_{out}$ which is N.F times the reference frequency $F_{ref}$.

While the voltage controlled oscillator 30 is operating at the N.F multiple of the reference frequency $F_{ref}$ as indicated in equation [8], the loop divider circuit 32 can only divide by "/N" or "/N+1". The resulting frequency signal back to the loop phase detector 14 from the loop divider circuit 32 is $$F_{feedback}=(N.F/N)\times F_{ref} \qquad [9]$$

and this frequency is compared to $F_{ref}$. Since the loop divider circuit 32 changes between two discrete ratios, a residual error pulse $t_e$ is created. Dividing by the two ratios "/N" and "/N+1" causes the frequency of the output signal $F_{out}$ of the loop divider circuit 32 to vary from the frequency of the reference frequency $F_{ref}$. The error pulse $t_e$ appears at the output terminal of the loop phase detector 14 at each reference clock pulse $F_{ref}$. The error pulse $t_e$ is filtered through the loop filter 16 with the loop voltage error $V_{err}$. The error pulse $t_e$ and the voltage error $V_{err}$ accumulate over time and modulate the output frequency signal $F_{out}$ of the voltage controlled oscillator 30 causing undesirable spurious signals to appear in the synthesizer output signal. The pulse width of the residual error appearing at the output terminal of the loop phase detector 14 is $$T_e = (1/F_{ref}) \times (1 - N/N.F) \qquad [10]$$

A timing diagram is shown in FIG. 3 which includes the residual error pulse $t_e$. The reference frequency $F_{ref}$ is shown as being a periodic signal. The frequency signal $F_{feedback}$ which is fed back to the loop phase detector 14 from the loop divider circuit 32 recited in equation [9] is shown. During three reference clock cycles, the instantaneous divide ratio $N_{div}$ of the loop divider circuit 32 is "/N". However, during the fourth reference clock cycle, the instantaneous divide ratio $N_{div}$ is "/N+1" in accordance with the description herein. This variation in the divide ratio leads to the residual error pulse $t_e$. As shown in FIG. 3, an error pulse $t_e$ occurs for each reference clock cycle and thus accumulates. The voltage error $V_{err}$ generated at the input of the voltage controlled oscillator (VCO) 30 accumulates in a similar manner with the error pulse $t_e$ as shown in FIG. 3.

A design computer simulation of a response of the loop filter 16 to the error pulse $t_e$ is illustrated in FIGS. 4 and 5. In this example, the instantaneous divide ratio "/N"=8158, the reference frequency $F_{ref}$=120 KHz, the fractional frequency Word "F"=0.25 and the bandwidth of the loop filter 16 is 3 KHz. The resulting width of the error pulse $t_e$ is 0.255 nS as indicated in FIG. 3. The simulation shows a peak-to-peak output of the loop filter 16 to be greater than one millivolt. The error voltage $V_{err}$ shown in FIG. 4 (error voltage $V_{err}$ vs. time) increases over time causing an accumulated error.

The corresponding spectrum of the error pulse $t_e$ shows frequency components in FIG. 5 (error voltage $V_{err}$ vs. frequency) which are spaced at 30 KHz increments. This incremental spacing is determined by $(F_{ref} \times F) = 120$ KHz$\times 0.25 = 30$ KHz. The lowest frequency component has a peak amplitude of 400 microvolts (0.0004 volts) as shown at point 40 in FIG. 5. These frequency components 40 will modulate the output frequency $F_{out}$ of the voltage controlled oscillator 30 causing undesirable spurious sidebands. Many of the spurs shown in FIG. 5 are caused by harmonics (as at point 42) which may possibly obliterate a communication on a channel adjacent to the channel that the spurs (40 and 42) appear on. An example of where such a problem might occur is in a cellular telephone system (not shown). This situation leads to the loss of spectral purity in the synthesizer output signal. As an example, if the gain of the voltage controlled oscillator 30 was 10 MHz/Volt, a sideband at 30 KHz of [20$\times$Log {(0.0004 V$\times$10 MHz)/(2$\times$30 KHz)}] or $-23.5$ (dBc) would result. Typical values required for a spurious sideband range from ($-55$ to $-75$) dBc.

Several attempts have been made to compensate for the existence of the error pulse $t_e$ appearing at the output terminal of the loop phase detector 14 and the corresponding error voltage $V_{err}$ generated at the input terminal of the voltage controlled oscillator 30. However, these approaches, which generally include compensation schemes utilizing digital-to-analog converters or switched current sources, are both costly to implement and difficult to maintain.

As shown in drawing FIG. 6 for purposes of illustration, the invention is embodied in a single-loop, digital error corrected Fractional-N synthesizer 100 of the type having a loop divider circuit 132 employing a variable divide ratio comprising integer "N" and fractional "F" components and an error pulse compensation circuit 150 which cancels the error pulse $t_e$ created by the operation of the variable divide ratio.

In accordance with the present invention, the error pulse compensation circuit 150 which provides a correction pulse $t_{cor}$ and a resistor summing network 152 which scales the total energy in the correction pulse $t_{cor}$ to be equal to the total energy in the residual error pulse $t_e$ cooperate to cancel the residual error pulse $t_e$ at a summing node 154. Further, the present invention incorporates an all digital design which requires no adjustment, eliminates drifts and variations in temperature and supply voltage associated with analog components, provides a lower cost design with reduced complexity, and has wide applicability in communication technology.

The single-loop, digital error corrected Fractional-N synthesizer 100 of the present invention is disclosed in FIGS. 6-9 and includes many of the main components of the circuitry of the Fractional-N synthesizer 10 of FIGS. 1-5. Components of the digital error corrected Fractional-N synthesizer 100 of the present invention shown in FIGS. 6-9 which find substantial correspondence in structure and function to those components of FIGS. 1-5 are designated with corresponding reference numerals of the one-hundred series.

In the present invention, a reference frequency generator 112, a loop phase detector 114, a low pass loop filter 116, a voltage controlled oscillator (VCO) 130 and an accumulator circuit 134 each perform the same function as that described with reference to the Fractional-N synthesizer 10 of FIG. 1. The reference frequency generator 112 provides the reference frequency $F_{ref}$ to the input terminal of the loop phase detector 114. A divided output frequency signal is also delivered to the detector 114 and compared to $F_{ref}$ for generating a loop error voltage $V_{err}$. The error voltage $V_{err}$ is filtered in a loop filter 116 comprised of an operational amplifier 118 and a series feedback resistor 120 and capacitor 122 and filter elements including resistors 124 and 126 and capacitor 128 connected to electrical ground.

The filtered loop error voltage $V_{err}$ is utilized to tune the voltage controlled oscillator 130 which is forced to slew in frequency to provide an output frequency signal $F_{out}$. A portion of the slewed signal $F_{out}$ is fed back to the phase detector 114 via a loop divider circuit 132 for reducing the error voltage $V_{err}$ to zero. The divider circuit 132, which includes a modulus controller 156, receives an external user-selected program word "/N" to program the divide ratio $N_{div}$ and to provide the divided output frequency signal. The output frequency signal $F_{out}$ of the voltage controlled oscillator 130 is also the synthesizer output signal. The error voltage $V_{err}$ will eventually approach zero by the feedback action.

In order to provide an output signal $F_{out}$ that has a frequency equal to a fractional multiple of the reference frequency $F_{ref}$, the loop divider circuit 132 must exhibit a variable divide ratio $N_{div}$. The possible values of $N_{div}$ are controlled by the accumulator circuit 134 which includes a latch 136 and an adder 138. The adder 138 receives a fractional frequency word "F" from an external source. The latch 136 and the adder 138 coop ⓡrate With the loop divider circuit 132 in the manner described regarding the Fractional-N synthesizer 10. After several reference clock cycles of adding the fractional frequency word "F" to the previous sum in the latch 136, the adder 138 reaches a maximum value. Thereafter, the adder 138 transmits a carryover output "$C_o$" of "+1" to the divider circuit 132 as shown in FIG. 6 for changing the divide ratio from "/N" to "/N+1". The carryover output $C_o$ then returns to zero and the process repeats. The use of two divider ratios provides for an average divide ratio "DIV" see equations [5]-[7]) effectively varying over time in which $N_{div}$ has the value "/N" for (n−1) clock cycles and the value "/N+1" for one clock cycle.

Since the loop divider circuit 132 changes between two discrete ratios, the residual error pulse $t_e$ appears at the output terminal of the phase detector 114 at each reference clock pulse $F_{ref}$. The error pulse $t_e$ is filtered through the loop filter 116 with the loop voltage error $V_{err}$ at the voltage controlled oscillator 130. The voltage error $V_{err}$ accumulates over time and modulates the output frequency signal $F_{out}$ causing undesirable spurious signals to appear in the synthesizer output signal. In the present invention, the correction pulse $t_{cor}$ is added to the error pulse $t_e$ at the summing node 154 shown in FIG. 6. Since the correction pulse $t_{cor}$ has energy equal to and opposite from that of the error pulse $t_e$, the spurious sidebands are canceled or at least significantly reduced. If the width of the correction pulse $t_{cor}$ was equal to the width of the error pulse $t_e$, a perfect cancellation would result. However, this would require a reference clock speed of several gigahertz for the digital logic to implement this narrow pulse. The approach employed in the present invention utilizes a lower reference frequency and enables the desirable feature of utilizing lower cost CMOS technology. The correction pulse $t_{cor}$ is significantly wider than the error pulse $t_e$ when utilizing the lower speed logic. However, by scaling down the amplitude of the correction pulse $t_{cor}$ with the resistor summing network 152, total energy equivalent to that of the error pulse $t_e$ is achieved.

The loop divider circuit 132 is comprised of the modulus controller 156 and a variable modulus prescaler 158 as shown in FIG. 6. In combination, the controller 156 and prescaler 158 provide the variable divide ratio $N_{div}$. The clocks for the correction logic are derived from the voltage controlled oscillator 130 through the variable modulus prescaler 158. The modulus prescaler 158 functions to divide the high output frequency $F_{out}$ by a dual modulus to provide a lower frequency signal which is then transmitted to the modulus controller 156. The lower frequency signal permits the use of a conventional divider circuit 132.

In particular, the modulus controller 156 can incorporate conventional CMOS technology which is more economical to manufacture and operates at a lower power level and at a lower frequency. The variable modulus prescaler 158 permits lower frequency programmable counters (not shown) to function without the loss of resolution at frequencies of several hundred megahertz. In the present invention, the dual modulus is 64/65 which has been selected to reduce $F_{out}$ (from approximately 900 MHz) to a value that is capable of being divided by conventional CMOS hardware. The logic is sequenced such that the clocks are processed only during the /65 modulus. Thus, the minimum width of the correction pulse $t_{cor}$ for cancellation of the error pulse $t_e$ is $$t_{cor} \text{ minimum pulse width} = 65/(N \cdot F \times F_{ref}) \qquad [11]$$

The voltage controlled oscillator 130 drives the variable modulus prescaler 158 which includes the dual modulus. The divide ratio $N_{div}$ can vary between the two divider values "/64" and "/65". The combination of the two divide ratios of the variable modulus prescaler 158 provides the variable divide ratio $N_{div}$. Further, the divide ratio $N_{div}$ of the variable modulus prescaler 158 is controlled by the modulus controller 156. It is noted that the equations previously presented in the description of the Fractional-N synthesizer 10 of FIG. 1 (particularly equations 1-3) are also applicable to the Fractional-N synthesizer 100 disclosed in FIG. 6. The divided output signal is then fed back from the modulus controller 156 of the divider circuit 132 to the phase detector 114.

A portion of the clock signal output of the variable modulus prescaler 158 is used to drive or clock a binary counter 160 as shown in FIG. 6. The binary counter 160 incorporates the same low power CMOS technology employed in the modulus controller 156 and thus is compatible therewith. The function of the binary counter 160 is to provide a periodic multi-digit word to a digital magnitude comparator 162. The value of the multi-digit word in the binary counter 160 is incremented at a multiple of the reference frequency $F_{ref}$. In the present invention, the output frequency signal of the voltage controlled oscillator 130 divided by $N_{div}$ (where $N_{div}=$"/64") is delivered to the binary counter 160. The binary counter 160 then increments to the next binary state (0, 1, 2, ..., 16) with each clock transition of the "/64" divider of the modulus prescaler 158. Thus, the incrementing of the binary counter 160 is much faster than the clock period of the reference frequency $F_{ref}$.

The magnitude comparator 162 includes an "A" input terminal, a "B" input terminal and an output terminal as shown in FIG. 6. The latch 136 of the accumulator circuit 134 is connected to the "A" input terminal While the binary counter 160 is connected to the "B" input terminal. The output of the latch 136 of the accumulator circuit 134 represents the incremented value of the fractional portion of the frequency word "F". With every reference clock pulse $F_{ref}$, the accumulator circuit 134 increments its digital value upward (0, 1, 2, ..., 16).

The function of the magnitude comparator 162 is to compare the incremented value of the binary counter 160 with the incremented value of the accumulator circuit 134 and to generate an output signal as a result of the comparison. At each and every increment value of the accumulator circuit 134, the binary counter 160 generates several increment values. Some of the increment values generated by the binary counter 160 are greater than and some are less than the incremented value of the accumulator circuit 134. During the comparison, there is a period of time when the multi-digit word of the binary counter 160 is less than the magnitude of the increment value of the accumulator circuit 134 (e.g., A>B, see FIG. 6). Under these conditions, the magnitude comparator 162 generates a logical one which is transmitted to the resistor summing network 152. Likewise, there is a period of time during the comparison when the multi-digit word of the binary counter 160 is greater than the magnitude of the increment value of the accumulator circuit 134 (e.g., B>A). Under these conditions, the magnitude comparator 162 generates a logical zero.

Thus, by comparing the accumulated fractional word "F" incremented with $F_{ref}$ at the "A" input with the multi-digit word incremented at a multiple of $F_{ref}$ at the "B" input, the magnitude comparator 162 generates a pulse width as a function of the value of the two inputs The output signal of the magnitude comparator 162 is either a logical one or a logical zero. If the output signal is a logical one, a correction pulse $t_{cor}$ is generated to cancel the error pulse $t_e$. The generated correction pulse $t_{cor}$ reflects the presence of the error pulse $t_e$ at the output terminal of the phase detector 114. The output of the magnitude comparator 162 is a logical one for a finite number of pulses which is determined by the output signal of the voltage controlled oscillator 130 divided by $N_{div}$ (e.g., "/64"). It is noted that after the initial correction pulse $t_{cor}$ is generated and added to the error pulse $t_e$ at the summing node 154, any non-canceled error pulse is referred to as the "residual error pulse" $t_e$. The residual error pulse $t_e$ is minimized by repeated feedback action. If the output signal is a logical zero, error correction does not occur at the summing node 154. This condition implies that a residual error pulse $t_e$ is not present at the output terminal of the phase detector 114.

The logical one generated by the magnitude comparator 162 is summed through the resistor summing network 152 to form the correction pulse $t_{cor}$. The resistor summing network 152 is comprised of resistor 124 located at the input to the loop filter 116 and a resistor 164 located between the magnitude comparator 162 and the summing node 154. The size ratio of the two resistors 124 and 164 are selected to scale the total energy in the correction pulse $t_{cor}$ to be equal and opposite to the total energy in the error pulse $t_e$. Thus, the summation of the two pulses, $t_e$ and $t_{cor}$, at the summing node 154 results in cancellation of the $t_e$ as indicated below. For the total energy in the $t_{cor}$ to equal the total energy in the $t_e$, the following must exist $$E_{err} + E_{cor} = 0 \quad [12]$$

In the present invention, the supply voltage for all CMOS logic components is designated $V_{cc}$. If the scaling resistor 124 is designated by $R_1$, the total energy in the error pulse $t_e$ is defined as $$E_{err} = (V_{cc}^2/R_1) \times t_e \quad [13]$$

Further, where scaling resistor 164 is designated by $R_2$ the total energy in the correction pulse $t_{cor}$ is defined as $$E_{cor} = (V_{cc}^2/R_2) \times t_{cor} \quad [14]$$

By equating the two equations [13] and [14] and simplifying terms, the following expression is obtained.

$$t_e/R_1 = t_{cor}/R_2 \quad [15]$$

Transposition of equation [15] provides $$R_2/R_1 = t_{cor}/t_e \quad [16]$$

Based upon the expressions for the pulse width of the error pulse $t_e$ and the correction pulse $t_{cor}$ in equations [10] and [11], respectively, an expression for the ratio of the scaling resistors 124 and 164 is $$R_2/R_1 = (65/N.F \times F_{ref})/(1 - (N/N.F)(1/F_{ref})) \quad [17]$$

By simplifying equation [17], the final expression which ensures that the energy in the correction pulse $t_{cor}$ is equal to the energy in the error pulse $t_e$ is $$R_2/R_1 = 65/.f \quad [18]$$

Thus, the ratio of the correction pulse $t_{cor}$ to the error pulse $t_e$ is equal to the prescaler divide ratio ("/65") divided by the fractional portion ("F") of the frequency word. It is noted that the ratio is controlled by scaling resistors 124 ($R_1$) and 164 ($R_2$).

A detailed timing diagram is shown in FIG. 7. The reference frequency $F_{ref}$ is shown as a periodic signal. The relationship between the error pulse $t_e$, the output signal of the binary counter 160 and the correction pulse $t_{cor}$ is shown. Note that the output signal of the magnitude comparator 162 is at a logical one as long as the output signal of the accumulator circuit 134 is greater than the multi-digit word of the binary counter 160. Thus, a correction pulse $t_{cor}$ is created having a width proportional to the width of the error pulse $t_e$. By selecting the scaling resistors 124 and 164 at the appropriate ratio (65/.F), the energy in the correction pulse $t_{cor}$ will equal the energy in the error pulse $t_e$.

A second design computer simulation was conducted. The second simulation was of a response of the loop filter 116 to the error pulse $t_e$ and the results are illustrated in FIGS. 8 and 9. The circuit parameters in this example are the same as that utilized in the example illustrated in FIGS. 4 and 5. FIG. 8 illustrates the corrected error voltage $V_{err}$ vs. time and shows that the error voltage $V_{err}$ is reduced in magnitude. A comparison of FIGS. 4 and 8 illustrates that the uncorrected error voltage of FIG. 4 is on the order of (1-5) millivolts while the corrected error voltage shown in FIG. 8 is on the order of (5-18) microvolts.

FIG. 9 illustrates the error voltage $V_{err}$ vs. frequency and shows a reduction in the magnitude of the spurious signals in the output frequency signal $F_{out}$. The 30 KHz frequency component that originally exhibited a 400 microvolt (0.0004 V) spur amplitude in the uncorrected circuit of FIG. 5 was reduced to 4.4 microvolts (0.0000044 V). This is a significant spur reduction of 39 dB. The resulting (−23.5) dBc spur occurring in the uncorrected example previously disclosed for the Fractional-N synthesizer 10 would be reduced to (−62.5) dBc by employing the corrected Fractional-N synthesizer 100 of the present invention.

The single-loop Fractional-N synthesizer 100 of the present invention utilizes a digital approach that can be readily implemented using low cost, off-the-shelf components which reduces the overall circuit complexity and expense. The all digital design approach requires no adjustments. Further, drifts and variations due to temperature and supply voltage associated with previously employed analog components are eliminated. The present invention has wide applicability to communication technology and specifically to dual mode cellular telephone technology. The correction timing and signal generation are performed digitally resulting in close tracking of the error pulse te by the correction pulse $t_{cor}$ over varying system parameters such as temperature and supply voltage.

Thus, the present invention has been described herein with reference to a particular embodiment for a particular application. Those having ordinary skill in the art and access to the present teachings will recognize additional modifications, applications and embodiments within the scope thereof. For example, although described in the form of a digital application, the error compensation circuit of the present invention can also be implemented in analog form.

It is therefore intended by the appended claims to cover any and all such modifications, applications and embodiments within the scope of the present invention.

Accordingly,

What is claimed is:

1. A digital error corrected synthesizer comprising:
   means for providing a reference frequency signal;
   detector means for providing an error voltage at an output terminal proportional to a phase difference between said reference frequency signal and a feedback signal;
   means for guiding an output signal having a frequency equal to a fractional multiple of said reference frequency signal and proportional to said error voltage;
   means for dividing said output signal by one of a plurality of divisors to provide said feedback signal to said detector means, said plurality of divisors creating a residual error signal at said output terminal of said detector means;
   means for generating a correction signal to cancel said residual error signal, said correction means being coupled between said means for providing a reference frequency and said dividing means; and
   canceling means coupled between said correction signal means and the output of said detector means, wherein said canceling means comprises a resistor summing network for scaling the total energy in said correction signal to be equal to the total energy in said residual error signal.

2. The digital error corrected synthesizer of claim 1 wherein said means for providing said reference frequency signal is a reference frequency generator.

3. The digital error corrected synthesizer of claim 1 wherein said detector means comprises a loop phase detector.

4. The digital error corrected synthesizer of claim 1 wherein said means for providing an output signal includes a voltage controlled oscillator.

5. The digital error corrected synthesizer of claim 1 wherein said means for dividing said output signal comprises a divider circuit having a variable modulus prescaler for down converting the frequency of said output signal.

6. The digital error corrected synthesizer of claim 5 wherein said divider circuit further includes a modulus controller for controlling the selection of said one of said plurality of divisors.

7. The digital error corrected synthesizer of claim 1 further including a loop filter for rejecting undesirable components from said detector means.

8. The digital error corrected synthesizer of claim 7 wherein said loop filter includes an amplifier for amplifying said error voltage.

9. The digital error corrected synthesizer of claim 1 further including an accumulator circuit for transmitting a signal to a modulus controller in communication with said dividing means for selecting a second of said plurality of divisors.

10. A digital error corrected synthesizer comprising;
    means for providing a reference frequency signal;
    detector means for providing an error voltage proportional at an output terminal to a phase difference between said reference frequency signal and a feedback signal;
    means for providing an output signal having a frequency equal to a fractional multiple of said reference frequency signal and proportional to said error voltage;
    means for dividing said output signal by one of a plurality of divisors to provide said feedback signal to said detector means, said plurality of divisors creating a residual error signal at said output terminal of said detector means; and
    means for generating a correction signal to cancel said residual error signal, said correction means being coupled between said reference frequency signal providing means and said dividing means; and
    canceling means coupled between said correction signal means and the output of said detector means;
    wherein said means for generating a correction signal comprises a binary counter for providing a binary word to a magnitude comparator.

11. The digital error corrected synthesizer of claim 1 wherein said means for generating a correction signal comprises a magnitude comparator for sensing the presence of said residual error signal and for providing said correction signal to said canceling means.

12. A method for canceling digital errors generated within a synthesizer, said method comprising the steps of:
    providing a reference frequency signal;
    providing an error voltage proportional to a phase difference between said reference frequency signal and a feedback signal and a residual error signal;
    providing an output signal having a frequency equal to a fractional multiple of said reference frequency signal and proportional to said error voltage;
    dividing said output signal by one of a plurality of divisors to provide said feedback signal, said plurality of divisors creating said residual error signal;
    generating a correction signal to cancel said residual error signal;
    canceling said residual error signal by summing said correction signal with said residual error signal; and
    scaling the total energy in said correction signal to be equal tot he total energy in said residual error signal.

13. The method of claim 12 further including the step of down converting the frequency of said output signaling a variable modulus prescaler to a usable level.

14. The method of claim 12 further including the step of controlling the selection of said plurality of divisors by a modulus controller to provide said feedback signal.

15. The method of claim 12 further including the step of sensing the presence of said residual error signal with a magnitude comparator prior to generating said correction signal to cancel said residual error signal.

* * * * *